(12) United States Patent
Oberdieck et al.

(10) Patent No.: US 12,339,312 B2
(45) Date of Patent: Jun. 24, 2025

(54) METHOD AND DEVICE FOR ADAPTING TEMPERATURES OF SEMICONDUCTOR COMPONENTS

(71) Applicant: Robert Bosch GmbH, Stuttgart (DE)

(72) Inventors: Karl Oberdieck, Neckartenzlingen (DE); Jan Homoth, Reutlingen (DE); Jonathan Winkler, Sonnenbuehl (DE); Manuel Riefer, Reutlingen (DE); Michael Maercker, Stuttgart (DE); Sebastian Strache, Wannweil (DE)

(73) Assignee: ROBERT BOSCH GMBH, Stuttgart (DE)

( * ) Notice: Subject to any disclaimer, the term of this patent is extended or adjusted under 35 U.S.C. 154(b) by 360 days.

(21) Appl. No.: 18/155,380

(22) Filed: Jan. 17, 2023

(65) Prior Publication Data
US 2023/0228810 A1  Jul. 20, 2023

(30) Foreign Application Priority Data
Jan. 20, 2022 (DE) ...................... 10 2022 200 632.1

(51) Int. Cl.
*G01R 31/28* (2006.01)
*G01R 31/26* (2020.01)
(52) U.S. Cl.
CPC ..... *G01R 31/2875* (2013.01); *G01R 31/2601* (2013.01); *G01R 31/2879* (2013.01)
(58) Field of Classification Search
CPC ....... H02M 1/327; G05D 23/20; H04L 45/24; H04L 45/245; H04L 47/125;
(Continued)

(56) References Cited

U.S. PATENT DOCUMENTS 9,046,912 B1 * 6/2015 Liu .................... H03K 17/0828
2007/0007519 A1 * 1/2007 Durbaum ............ H03K 17/122
257/48
(Continued)

FOREIGN PATENT DOCUMENTS

EP      2911191 A2    8/2015
JP   2019075891 A    5/2019

*Primary Examiner* — Son T Le
(74) *Attorney, Agent, or Firm* — NORTON ROSE FULBRIGHT US LLP

(57) ABSTRACT

A method and device for adapting temperatures of semiconductor components. The device includes a first and second semiconductor component, and an evaluation unit. The evaluation unit is configured to ascertain a first and second temperature of the first and second semiconductor component, respectively, calculate a first and second temperature deviation, which represents a deviation of the first and second temperature from a reference temperature, respectively, and adapt a first gate voltage of the first semiconductor component and/or a second gate voltage of the second semiconductor component until the first temperature deviation and the second temperature deviation are smaller than or equal to a predefined maximum allowable temperature deviation from the reference temperature. The adaptation takes place only when a predefined allowable control range for the respective gate voltage is not exceeded, and when the first temperature and/or the second temperature is/are greater than the reference temperature.

11 Claims, 2 Drawing Sheets

(58) Field of Classification Search
CPC ... H04L 47/2483; H04L 69/14; H04L 69/164; G01R 31/26; G01R 31/2601; G01R 31/28; G01R 31/2875; G01R 31/2879; Y02D 30/50; H03K 17/0822; H03K 17/122; H03K 17/145; H03K 2017/0806
See application file for complete search history.

(56) References Cited

U.S. PATENT DOCUMENTS

2008/0150609 A1 6/2008 Durbaum
2018/0131361 A1 5/2018 Ewanchuk et al.

* cited by examiner

METHOD AND DEVICE FOR ADAPTING TEMPERATURES OF SEMICONDUCTOR COMPONENTS

FIELD

The present invention relates to a method and to a device for adapting temperatures of semiconductor components.

BACKGROUND INFORMATION

In power semiconductor modules, multiple semiconductors are frequently interconnected in parallel. The more similarly these semiconductors are utilized, the higher is an efficiency of a component that includes these semiconductors. The efficiency is measured by a current conductive with the aid of the semiconductors, accordingly, a limit of the efficiency of the component is already reached when one of the semiconductors of the component exceeds its operating limits. This operating limit is a result of the maximum junction temperature of the hottest semiconductor. Respective temperatures of the semiconductors in this case are measured preferably individually.

Deviations with respect to the efficiency or to conduction losses of individual semiconductors are a result on the one hand of the manufacturing process of the semiconductors. On the other hand, a particular design, a packaging technology and effects of degradation also have an impact. Accordingly, such tolerances are taken into account in the related art when designing semiconductors which, as a result of particular design margins, has a direct impact on costs and a utilization of components.

SUMMARY

According to a first aspect of the present invention, a method is provided for adapting temperatures of semiconductor components.

In a first step of the method according to an example embodiment of the present invention, a first temperature of a first semiconductor component and a second temperature of a second semiconductor component are ascertained, the first temperature and the second temperature preferably relating to respective junction temperatures of the semiconductor components. The present step here of ascertaining and method steps described below are carried out, for example, using an evaluation unit according to the present invention, which is able to receive and/or to calculate pieces of temperature-related information with respect to the first semiconductor component and to the second semiconductor component. The first temperature and the second temperature are detected, for example, with the aid of temperature sensors, which are assigned to the respective semiconductor components. For this purpose, the temperature sensors are preferably connected by means of information technology to the evaluation unit according to the present invention. The first semiconductor component and the second semiconductor component are, for example, each power semiconductors, such as SiC-MOSFETs or (power) semiconductors or (power) semiconductor modules differing therefrom.

In a second step of the method according to an example embodiment of the present invention, a first temperature deviation, which represents a deviation of a first temperature from a reference temperature, and a second temperature deviation, which represents a deviation of the second temperature from the reference temperature, are calculated.

In a third step of the method according to an example embodiment of the present invention, a first gate voltage of the first semiconductor component and/or a second gate voltage of the second semiconductor component is/are adapted until the first temperature deviation and the second temperature deviation are smaller than or equal to a predefined maximum allowable temperature deviation from the reference temperature, the adaptation of the gate voltage being suitable for changing a power loss of the respective semiconductor components. The adaptation of the respective gate voltages takes place only when a predefined allowable control range for the gate voltage (which is extracted, for example, from a data sheet of the semiconductor components) is not exceeded and when the first temperature and/or the second temperature is/are greater than the reference temperature.

As a result of the adaptation of the respective gate voltages according to the present invention, it is advantageously possible to increase or match service lives of semiconductor components to one another, which are generated, in particular, by manufacturing tolerances. In addition, a reduction of a temperature-related design reserve of the semiconductor components is enabled which, in turn, may effectuate a reduction in manufacturing costs.

It is generally noted that the method according to the present invention may be used for a greater number of semiconductor components and is not restricted to the two semiconductor components described as representative above. This means that the method according to the present invention may be advantageously used, for example, for matching respective temperatures and/or service lives of three, four or more semiconductor components.

It is also possible to apply the method according to the present invention to semiconductor components connected in parallel and/or serially connected.

Preferred refinements of the present invention are disclosed herein.

The reference temperature is, for example, a predefined absolute temperature, which is statically or dynamically establishable. A static establishment takes place, for example, based on parameters of the semiconductor components and/or based on a field of application of the semiconductor devices and on expected boundary conditions related thereto (for example, surroundings temperature ranges). A dynamic establishment takes place preferably recurrently and/or taking instantaneous measured variables and/or instantaneous use conditions and/or instantaneous boundary conditions of the semiconductor components into account, so that a situationally adapted and preferably situationally optimally adapted reference temperature is always usable. Alternatively, the reference temperature is a relative temperature with respect to the first temperature and to the second temperature and, in particular, is an average of the first temperature and of the second temperature without being restricted as a result to an averaging as the only allocation possibility of the two temperature values. The ascertainment of the relative reference temperature advantageously takes place in each case after the ascertainment of the first temperature and of the second temperature, so that the subsequent method step for calculating the respective temperature deviations of the reference temperature is always based on an instantaneously ascertained reference temperature. To save measuring and calculation operations, however, it is also possible to recalculate the reference temperature with less frequency than the ascertainment of the first temperature and of the second temperature.

In one particularly advantageous example embodiment of the present invention, the first semiconductor component and the second semiconductor component are semiconductor components connected in parallel, which are used, in particular, for connecting higher power outputs. The respective semiconductor components are, for example, individual voltage-controlled semiconductors such as SiC-MOSFETs or semiconductors differing therefrom. Alternatively, the respective semiconductor components are designed as semiconductor modules (in particular, power modules), each of which includes a plurality of individual voltage-controlled semiconductors (in particular, connected in parallel). The matching of the temperatures and/or service lives of the respective semiconductor components may accordingly be applied both between individual semiconductors as well as between a plurality of semiconductor modules.

The first temperature and the second temperature are advantageously ascertained in each case with the aid of a temperature sensor and/or of temperature-sensitive parameters and/or of a temperature observer. Decisive in this case is the fact that the respective temperatures of the semiconductor components are ascertainable with a required accuracy separately from one another.

In one further advantageous example embodiment of the present invention, an order in the adaptation of the gate voltages of the respective semiconductor components is established in accordance with a degree of a respective temperature deviation, the gate voltage of that semiconductor component which has the highest temperature deviation being adapted first in each case. Alternatively or in addition, once the respective gate voltages have been adapted, at least one gate voltage of the semiconductor components corresponds essentially to a predefined maximum allowable gate voltage for the respective semiconductor components. With simultaneous matching of respective temperature deviations of the semiconductor components, a minimization of a total power loss across all semiconductor components involved in the method according to the present invention is thereby achieved.

The first gate voltage of the first semiconductor component and/or the second gate voltage of the second semiconductor component is/are advantageously successively adapted with the aid of a predefined voltage swing (which may be a positive or negative voltage swing with respect to the respectively instantaneous gate voltage). Such a successive adaptation is achieved as a result of a recurrent implementation of the method according to the present invention, the recurrent implementation taking place, for example, in predefined and/or dynamically adapted temporal intervals during a respective operating cycle. Alternatively or in addition, the recurrent implementation takes place in response to an occurrence of predefined events. Alternatively or in addition, the first gate voltage of the first semiconductor component and/or the second gate voltage of the second semiconductor component is/are adapted starting from an instantaneous gate voltage or starting from a predefined maximum allowable gate voltage of the respective semiconductor component.

Alternatively or in addition, it is possible to establish the respective voltage swing as a function of a degree of an influence of gate voltage changes on a respective channel resistance of the semiconductor components and/or as a function of a respective temperature deviation from the reference temperature (for example, with larger deviations, using a larger voltage swing). In this context, it is also possible to adapt the predefined voltage swing as a function of further boundary conditions. It is also possible to use an individually adapted voltage swing for each semiconductor component.

The gate voltages are advantageously established at the beginning of a respective operating cycle of the respective semiconductor components on the basis of predefined gate voltage values and/or on the basis of a history of gate voltage values from at least one preceding operating cycle. Alternatively or in addition, the respective gate voltages are established on the basis of a respective service life reserve of the semiconductor components and/or on the basis of instantaneous boundary conditions. The boundary conditions include, for example, an instantaneous temperature of the semiconductor components and/or an instantaneous temperature of a coolant, which is used for cooling the semiconductor components.

In one further advantageous example embodiment of the present invention, the method further includes: ascertaining a service life reserve of the respective semiconductor components on the basis of a history of temperature deviations of the respective semiconductor components and taking the respective service life reserve into account when adapting the respective gate voltages and/or when establishing the reference temperature and/or when establishing the maximum allowable temperature deviation from the reference temperature. This allows, for example, those semiconductor components to be relieved that have a lower service life reserve.

According to a second aspect of the present invention, a device is provided for adapting temperatures of semiconductor components. According to an example embodiment of the present invention, the device includes a first semiconductor component, a second semiconductor component, a first gate driver, a second gate driver, and an evaluation unit. The first semiconductor component and the second semiconductor component are, for example, each power semiconductors, such as SiC MOSFETs, or semiconductors or semiconductor modules differing therefrom. The evaluation unit is designed, for example, as an ASIC, an FPGA, a processor, a digital signal processor, a microcontroller or the like, and is configured to ascertain a first temperature of the first semiconductor component and a second temperature of the second semiconductor component. The first temperature and the second temperature are directly and/or indirectly ascertained, for example, with the aid of respective temperature sensors and/or on the basis of temperature-sensitive parameters and/or on the basis of a temperature observer as described above. In the case of a use of temperature sensors for ascertaining the respective temperatures of the semiconductor components, the temperature sensors are, for example, locally and thermally coupled directly to the respective semiconductor components. Alternatively or in addition, it is also possible to ascertain the respective temperatures via temperature sensors, which are situated in a coolant circuit for cooling the respective semiconductor components. The evaluation unit is further configured to calculate a first temperature deviation, which represents a deviation of the first temperature from a reference temperature and a second temperature deviation, which represents a deviation of the second temperature from the reference temperature. The evaluation unit is also configured to adapt a first gate voltage of the first semiconductor component with the aid of the first gate driver and/or to adapt a second gate voltage of the second semiconductor with the aid of the second gate driver until the first temperature deviation and the second temperature deviation are smaller than or equal to a predefined maximum allowable temperature deviation from the reference temperature, the adaptation of the gate voltage being suitable for changing a power loss of the respective semiconductor components. The adaptation of the respective gate voltages further takes place only when a predefined allowable control range for the respective gate voltage is not exceeded and the first temperature and/or the second temperature is/are greater than the reference temperature. It is noted that the evaluation unit, the first gate driver, and the second gate driver may be separate components or jointly integrated components, which are designed, for example, on the basis of a single ASIC. The features, feature combinations, as well as the advantages resulting therefrom, clearly correspond to those cited in connection with the first-mentioned invention aspect in such a way that to avoid repetitions, reference is made to the foregoing explanations.

BRIEF DESCRIPTION OF THE DRAWINGS

Exemplary embodiments of the present invention are described in detail below with reference to the accompanying drawings.

DETAILED DESCRIPTION OF EXAMPLE EMBODIMENTS

Figure 1:
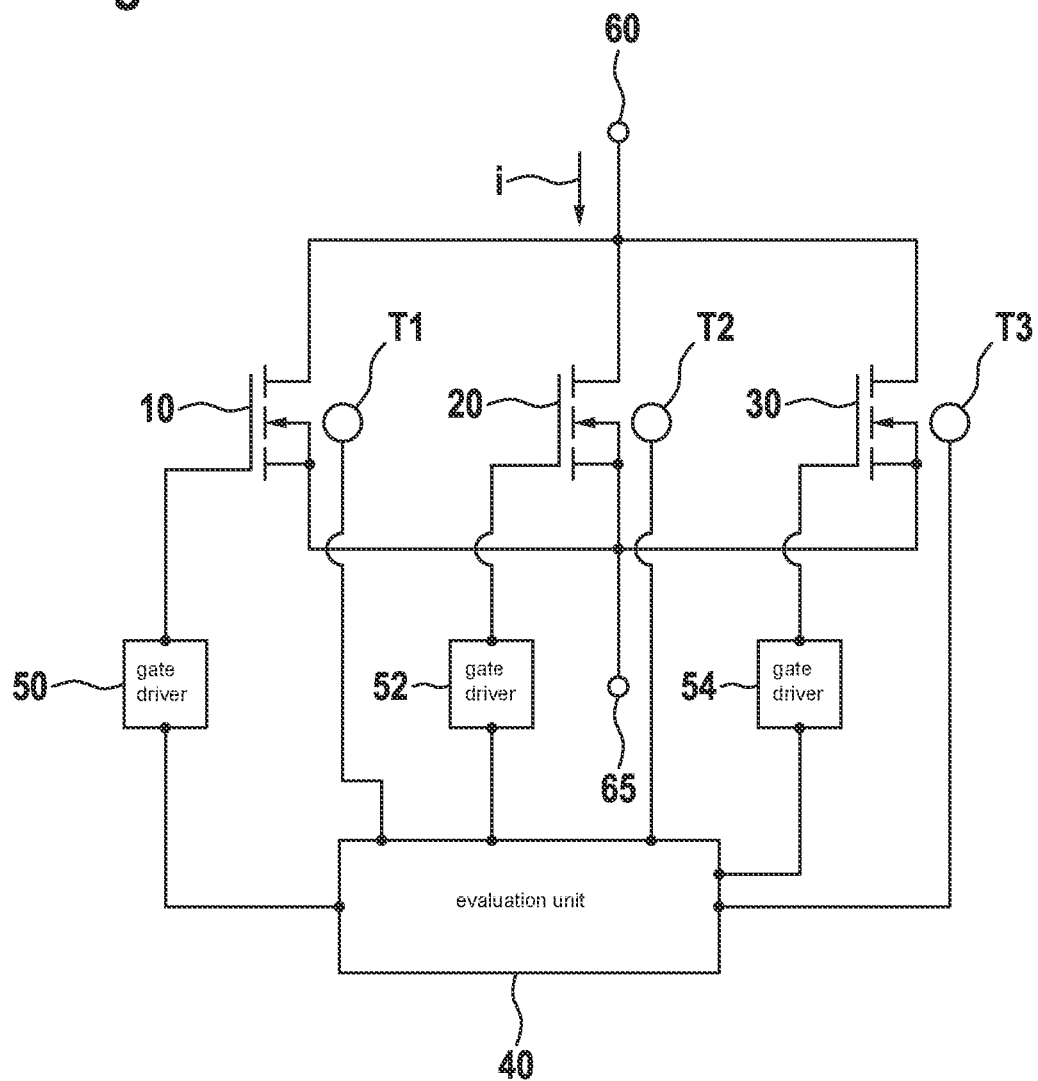
FIG. 1 shows a circuit diagram of one exemplary specific embodiment of a device according to the present invention.

FIG. 1 shows a circuit diagram of one exemplary specific embodiment of a device according to the present invention. The device includes a first MOSFET 10, a second MOSFET 20, and a third MOSFET 30, whose control inputs (i.e., whose gate terminals) are electrically connected to respectively corresponding gate drivers 50, 52, 54 of respective MOSFETs 10, 20, 30. Gate drivers 50, 52, 54 are connected by means of information technology to an evaluation unit 40, which is designed here as an ASIC and which is configured with the aid of the connection to gate drivers 50, 52, 54 to activate gate drivers 50, 52, 54 independently of one another in order to set respective gate voltages Vg1, Vg2, Vg3 of respective MOSFETs 10, 20, 30.

The device according to the present invention is configured in connection with MOSFETs 10, 20, 30 to switch an externally provided load current i, which is able to flow between a first terminal 60 and a second terminal 65 of the device according to the present invention.

In addition, the device according to the present invention includes a first temperature sensor T1, a second temperature sensor T2 and a third temperature sensor T3, which are thermally coupled in each case to their corresponding MOSFETs 10, 20, 30.

On the basis of the preceding configuration, evaluation unit 40 is configured to ascertain first, second and third temperatures of respective MOSFETs 10, 20, 30 and to calculate a first temperature deviation, which represents a deviation of the first temperature from a reference temperature, a second temperature deviation, which represents a deviation of the second temperature from the reference temperature, and a third temperature deviation, which represents a deviation of the third temperature from the reference temperature. The reference temperature in this case is calculated as an average of the measured first, second, and third temperature.

In addition, evaluation unit 40 is configured on the basis of the preceding configuration to adapt a first gate voltage Vg1 of first MOSFET 10 and/or a second gate voltage Vg2 of second MOSFET 20 and/or a third gate voltage Vg3 of third MOSFET 30 until the first temperature deviation, the second temperature deviation and the third temperature deviation are smaller than or equal to a predefined maximum allowable temperature deviation from the reference temperature, the adaptation of gate voltages Vg1, Vg2, Vg3 being suitable for changing a power loss of respective MOSFETs 10, 20, 30, and the adaptation of respective gate voltages Vg1, Vg2, Vg3 taking place only when a predefined allowable control range for gate voltage Vg1, Vg2, Vg3 is not exceeded and the first temperature and/or the second temperature and/or the third temperature is/are greater than the reference temperature.

Figure 2A:
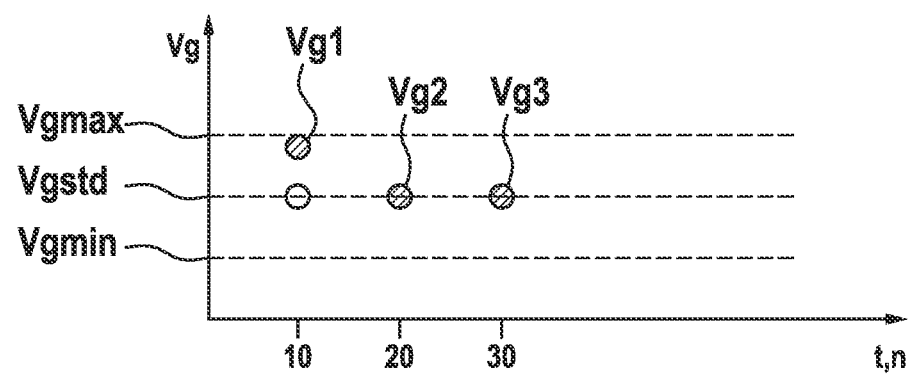
FIG. 2A shows a result of an initial implementation of a method according to the present invention.

FIG. 2A shows a result of an initial implementation of a method according to the present invention. The darkened circles each represent a result of an ascertainment of respective gate voltages Vg1, Vg2, Vg3 for a plurality of MOSFETs 10, 20, 30 connected in parallel according to the method according to the present invention described above. Respective gate voltages Vg1, Vg2, Vg3 correspond to respective MOSFETs 10, 20, 30 shown at the horizontal axis.

All MOSFETs 10, 20, 30 have been activated prior to the first implementation of the method according to the present invention with the aid of a predefined standard gate voltage value Vgstd, which lies between a predefined maximum gate voltage Vgmax and a predefined minimal gate voltage Vgmin. This value is represented—to the extent visible— with the aid of an unfilled circle. During this activation of MOSFETs 10, 20, 30 using the method according to the present invention, inadmissibly high temperature deviations of MOSFETs 10, 20, 30 from a predefined reference temperature are present.

Accordingly, the gate of that MOSFET 10, 20, 30, whose temperature value exhibits the highest exceedance of the reference temperature during the first implementation of the method according to the present invention is activated with the aid of the maximum gate voltage Vgmax. In this case, first MOSFET 10 is affected by this highest temperature deviation, which is why instantaneous gate voltage Vg1 of first MOSFET 10 has accordingly been adapted first. The accompanying reduction of the channel resistance of first MOSFET 10 minimizes a power loss generated by first MOSFET 10, as a result of which the temperature deviation from the reference value is reduced over time.

Respective gate voltages of second MOSFET 20 and of third MOSFET 30 are not yet adapted during the course of the first implementation of the method according to the present invention, since the order of the adaptation is oriented to the degree of the respective temperature deviation. Accordingly, gate voltages Vg2, Vg3 thereof are still at the predefined standard gate voltage Vgstd. In addition to respective MOSFETs 10, 20, 30, the horizontal axis also shows a temporal sequence of the adaption process of respective voltage values Vg1, Vg2, Vg3.

Figure 2B:
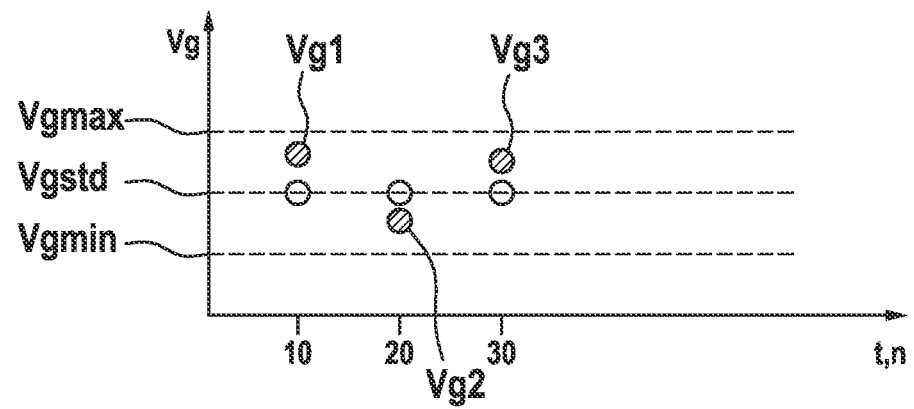
FIG. 2B shows a result of a further implementation of the method according to the present invention.

FIG. 2B shows a result of a further implementation of the method according to the present invention. FIG. 2B thus represents a time range after the time range represented by FIG. 2A. To avoid repetitions, only the differences with respect to FIG. 2A are described below.

FIG. 2B indicates that, in addition to a further adaptation of first gate voltage Vg1, the further implementation of the method according to the present invention has additionally resulted in an adaptation of second gate voltage Vg2 and of third gate voltage Vg3. The adaptation of gate voltages Vg1, Vg2, Vg3 in this case takes place in each case stepwise taking a predefined voltage swing into account, which is ascertained as a function of a respective initial temperature deviation.

The adaptation of first gate voltage Vg1, of second gate voltage Vg2, and of third gate voltage Vg3 means that the temperatures of all MOSFETs 10, 20, 30 are within the maximum allowable temperature deviation with respect to the reference temperature, while at the same time a best possible approximation of the individual temperatures of MOSFET 10, 20, 30 to one another is present. Due to the accompanying uniform temperature load of respective MOSFET 10, 20, 30, a similar individual service life and thus an increased overall service life of the circuit formed by MOSFETs 10, 20, 30 and a higher efficiency thereof are to be assumed.

What is claimed is:

1. A method for adapting temperatures of semiconductor components, comprising the following steps:
    ascertaining a first temperature of a first semiconductor component and a second temperature of a second semiconductor component;
    calculating a first temperature deviation which represents a deviation of the first temperature from a reference temperature, and a second temperature deviation, which represents a deviation of the second temperature from the reference temperature; and
    adapting a first gate voltage of the first semiconductor component and/or a second gate voltage of the second semiconductor component until the first temperature deviation and the second temperature deviation are smaller than and/or equal to a predefined maximum allowable temperature deviation from the reference temperature, the adaptation of the gate voltage being suitable for changing a power loss of the first and/or second semiconductor components;
    wherein the adaptation of the first gate voltage and/or the second gate voltage takes place only when a predefined allowable control range for the first gate voltage and/or the second gate voltage is not exceeded, and the first temperature and/or the second temperature is greater than the reference temperature.

2. The method as recited in claim 1, wherein the reference temperature is:
    a predefined absolute temperature, or
    a relative temperature with respect to the first temperature and the second temperature.

3. The method as recited in claim 1, wherein the reference voltage is an average of the first temperature and the second temperature.

4. The method as recited in claim 1, wherein the first semiconductor component and the second semiconductor component are:
    (i) semiconductor components connected in parallel, and/or
    (ii) individual voltage-controlled semiconductors or semiconductor modules which each include a plurality of individual voltage-controlled semiconductors.

5. The method as recited in claim 1, wherein the first temperature and the second temperature are each ascertained using:
    a temperature sensor, and/or
    temperature-sensitive parameters, and/or
    a temperature observer.

6. The method as recited in claim 1, wherein:
    (i) an order in the adaptation of the first and second gate voltages of the first and second semiconductor components is established in accordance with a degree of a respective temperature deviation, a gate voltage of a semiconductor component of the first and second semiconductor components having a highest degree of temperature deviation being adapted first, and/or
    (ii) once the first and second gate voltages have been adapted, at least one gate voltage of the first and second semiconductor components corresponds to a predefined maximum allowable gate voltage for the first and second semiconductor components.

7. The method as recited in claim 1, wherein the first gate voltage of the first semiconductor component and/or the second gate voltage of the second semiconductor component is:
    adapted successively using a predefined voltage swing, and/or
    adapted starting from an instantaneous gate voltage or starting from a predefined maximum allowable gate voltage of the first and/or second semiconductor component.

8. The method as recited in claim 7, wherein the voltage swing is established as a function of a degree of
    an influence of gate voltage changes on a respective channel resistance of the first and second semiconductor components and/or
    a respective temperature deviation from the reference temperature.

9. The method as recited in claim 1, wherein the first and second gate voltages are established at a beginning of a respective operating cycle of the first and second semiconductor components based on:
    predefined gate voltage values, and/or
    a history of gate voltage values from at least one preceding operating cycle, and/or
    a respective service life reserve of the first and second semiconductor components, and/or
    instantaneous boundary conditions.

10. The method as recited in claim 1, further comprising:
    ascertaining a service life reserve of the first and second semiconductor components based on a history of temperature deviations of the first and second respective semiconductor components, respectively, and
    taking the respective service life reserve into account when adapting the first and second gate voltages and/or when establishing the reference temperature and/or when establishing the maximum allowable temperature deviation from the reference temperature.

11. A device for adapting temperatures of semiconductor components, comprising:
    a first semiconductor component;
    a second semiconductor component;
    a first gate driver;
    a second gate driver; and
    an evaluation unit;
    wherein
        the evaluation unit is configured to:
            ascertain a first temperature of the first semiconductor component and a second temperature of the second semiconductor component,
            calculate a first temperature deviation which represents a deviation of the first temperature from a reference temperature, and a second temperature deviation which represents a deviation of the second temperature from the reference temperature, and adapt a first gate voltage of the first semiconductor component using the first gate driver and/or adapt a second gate voltage of the second semiconductor component using the second gate driver, until the first temperature deviation and the second temperature deviation are smaller than or equal to a predefined maximum allowable temperature deviation from the reference temperature, the adaptation of the gate first gate voltage and/or the second gate voltage being suitable for changing a power loss of the first and/or second semiconductor components, the adaptation of the first and/or second gate voltage taking place only when a predefined allowable control range for the first and/or second gate voltage is not exceeded, and the first temperature and/or the second temperature is greater than the reference temperature.

* * * * *